United States Patent
Giauque et al.

(10) Patent No.: US 6,723,436 B1
(45) Date of Patent: Apr. 20, 2004

(54) ELECTRICALLY CONDUCTING TERNARY AMORPHOUS FULLY OXIDIZED MATERIALS AND THEIR APPLICATION

(75) Inventors: Pierre Giauque, Pasadena, CA (US); Marc Nicolet, Pasadena, CA (US); Stefan M. Gasser, Zürich (CH); Elzbieta A. Kolawa, Bradbury, CA (US); Hillary Cherry, Manhattan Beach, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 09/532,461

(22) Filed: Mar. 22, 2000

Related U.S. Application Data

(60) Provisional application No. 60/126,230, filed on Mar. 22, 1999.

(51) Int. Cl.[7] .............................. B32B 9/00; H01G 4/228
(52) U.S. Cl. ...................... 428/446; 428/697; 428/701; 428/702; 361/306.1; 501/154
(58) Field of Search ............................. 428/446, 697, 428/701, 702; 501/154; 361/271, 306.1; 252/519.1, 519.12, 521.1, 521.3

(56) References Cited

U.S. PATENT DOCUMENTS

| | | | | |
|---|---|---|---|---|
| 5,851,896 A | * | 12/1998 | Summerfelt | 438/396 |
| 5,966,153 A | * | 10/1999 | Mitani et al. | 347/62 |
| 6,294,420 B1 | * | 9/2001 | Tsu et al. | 438/239 |

FOREIGN PATENT DOCUMENTS

| | | | |
|---|---|---|---|
| JP | 405109585 A | * | 4/1993 |
| JP | 405147972 A | * | 6/1993 |
| JP | 405155620 A | * | 6/1993 |

OTHER PUBLICATIONS

Pisch et al., "Thermodynamic calculations offer insight in the stability of materials; the annealing behavior of amorphous Ru—Si—O and Ir—Si—O thin films", *Calphad.*, vol. 25, No. 4, pp. 639–644 (2001) no month.

* cited by examiner

*Primary Examiner*—Stephen Stein
(74) *Attorney, Agent, or Firm*—Fish & Richardson P.C.

(57) ABSTRACT

Electrically active devices are formed using a special conducting material of the form Tm—Ox mixed with $SiO_2$ where the materials are immiscible. The immiscible materials are forced together by using high energy process to form an amorphous phase of the two materials. The amorphous combination of the two materials is electrically conducting but forms an effective barrier.

5 Claims, 1 Drawing Sheet

ELECTRICALLY CONDUCTING TERNARY AMORPHOUS FULLY OXIDIZED MATERIALS AND THEIR APPLICATION

CROSS REFERENCE TO RELATED APPLICATIONS

This application claims the benefit of the U.S. Provisional Application No. 60/126,230, filed on Mar. 22, 1999.

STATEMENT AS TO FEDERALLY SPONSORED RESEARCH

The invention described herein was made in the performance of work under a NASA contract, and is subject to the provisions of Public Law 96-517 (35 U.S.C. 202) in which the Contractor has elected to retain title.

BACKGROUND

Thin films are used in many devices. The stability of these devices is often determined by the degradation of the thin films and/or their interaction with adjacent materials.

Ferroelectric and high dielectric constant materials have been suggested as materials to obtain new and improved results in various applications. One application is in forming capacitors based on these materials. These eventual materials can be integrated on a chip with a silicon-based device. However, issues exist as part of integrating the material that is used. Preparation of the Ferroelectric and high dielectric materials are performed at relatively high temperatures, e.g. 400 to 800° C., in oxidizing environments. This imposes limitations on the choice of a suitable electrode material.

In addition, the use of complex compositions may cause undesired reactions, and possible deterioration of the materials. One approach to minimize undesirable interactions between such materials is to insert a barrier layer between the materials. This layer should be stable in its contact with its adjacent materials. The barrier should also hinder the diffusion of adjacent species across it. In applications where an electrical current must be able to flow across the layer, as is the case of contacts to electronic devices, the barrier layer also needs to be electrically conducting. Barriers have been used to block certain diffusion types. However, the use of a barrier results in a complex multi-layered electrode/barrier structure.

One suggested operation has been to deposit a contact on a polysilicon substrate, and to deposit a ferroelectric electrode on the contact. The deposition is done between 400 and 700° C., e.g. 500° C., using MOCVD. The deposited ferroelectric material is annealed under a partial pressure of oxygen in order to nucleate and grow a crystalline ferroelectric phase. This oxidizing environment grows the crystal at a high partial pressure of oxygen.

In the prior art, this oxygen has caused certain problems. The oxygen moves along the material, and can oxidize surfaces on the material. For example, the contact layer on the polysilicon is often itself a silicon material. A thin layer of a non-oxidizing contact material, such as platinum is often placed on the silicon. The platinum can itself oxidize, or material below the platinum can oxidize. The polysilicon underlayer can also oxidize. A diffusion barrier can be formed to prevent the oxygen from entering the polysilicon.

Alternatives to the platinum electrode have been suggested. A ruthenium dioxide electrode has been suggested, for example in "Electrode Structures for Integration of Ferroelectric or High Dielectric Constant Films in Semiconductor Device" Albert Grill, IBM Research Division, 1999. Ruthenium dioxide forms an efficient material, However, ruthenium dioxide is not "fully oxidized", On heating, ruthenium dioxide can react to form a volatile $RuO_4$ compound which evaporates to gas. The disassociation leaves ruthenium dioxide crystals.

Nicolet et al. has suggested using ternary thin films of the type TM—Si—N. This introduces an additional compound (N) into the mix of compounds. This additional compound raises a possibility of additional undesired reactions.

SUMMARY

The present application teaches a conducting layer, formed on an electrically active structure, the conductive layer being formed of a ternary oxide material having first and second immiscible compounds, said first and second immiscible compounds having one common oxygen element, which are formed in an amorphous state, and are meta-stable relative to one another over a specified range. An embodiment describes a specific material for use in forming contacts which have specific advantageous properties; including high resistance to oxidation, electrical conductivity, and formation of a block to the passage of certain materials such as oxygen.

A specific material described herein is an electrically-conducting fully oxidized transition metal compound combined with an oxide of a different material, where the two materials are immiscible at the temperature range of interest and in combination form an amorphous material. The transition metal can be any of a number of desired transition metals, with preferred materials being ruthenium, (Ru) iridium (Ir) and osmium (OS). other materials are described herein.

The additional oxide can be an oxide of Silicon or of another material. Silicon is preferred since the SiO2 material is generally grown on a silicon substrate which can prevent additional reactions.

On particularly interesting material is a ternary material of the type Ru—Si—O.

Another material is a ternary thin film of the type Tm—Si—O where Tm is a transition metal of the Ti, V, chromium groups.

BRIEF DESCRIPTION OF THE DRAWINGS

These and other aspects will be described in detail with reference to the drawings in which.

DESCRIPTION OF THE PREFERRED EMBODIMENT

Figure 1:
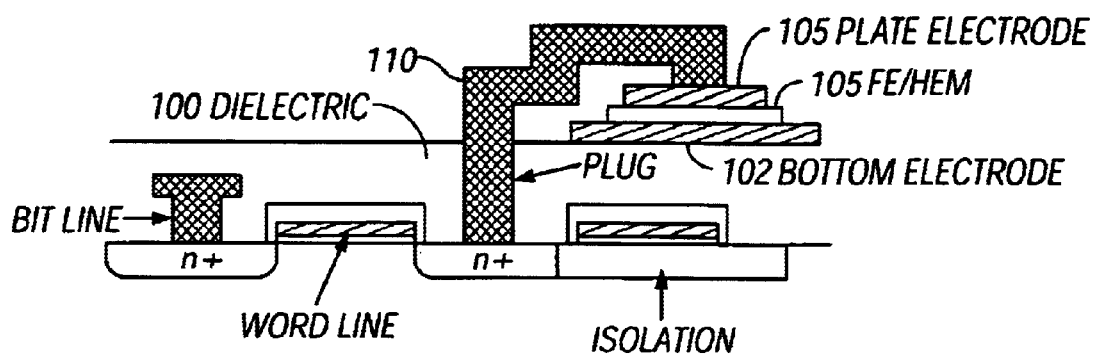
FIG. 1 shows a first diagram of top contact capacitor using the specified dielectric materials.
Figure 2:
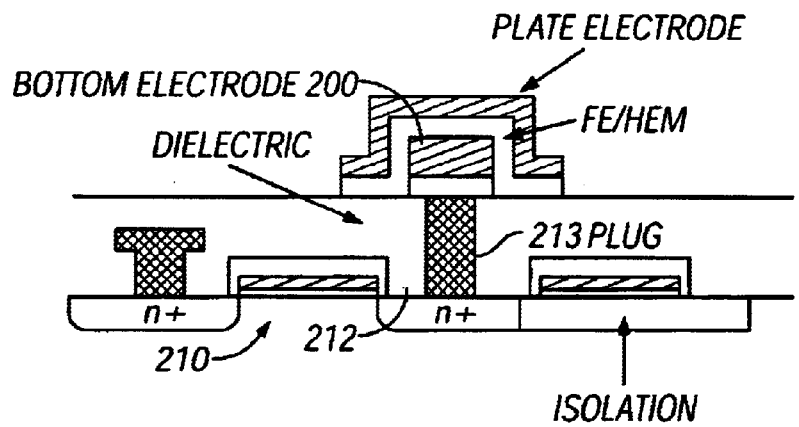
FIG. 2 shows a diagram of a high density capacitor over bit line type using the material.

Amorphous films are generally superior to polycrystalline films as barriers to diffusion. In thin polycrystalline films the mechanism of diffusion along grain boundaries or extended defects can be very fast compared to the bulk mechanisms of diffusion when the temperature is about half of the absolute melting point of the material, or below. Integrated circuits operate in that temperature range, meaning that the performance of a barrier layer depends on its microstructure and therefore on its deposition conditions. As a remedy, barrier layers have been developed in recent years that are electrically conducting and have an amorphous or near-amorphous structure in which grain boundaries and extended defects do not exist. Their structure is also highly metastable, meaning that the nucleation and growth of crystalline grains is set only at high temperatures.

These films typically consist of an early transition metal, silicon, and nitrogen. They are normally deposited by reactive sputtering of the metal and the silicon. $Ta_{36}Si_{14}N_{50}$, for example, crystallized only above 900° C. after 30 min of heat treatment in vacuum. The combination of Ta, Si, and N in the Ta—Si—N barrier is only one case of a group of ternary nitrides that all share the same general characteristics of Ta—Si—N. These nitrides are of the generic form TM—Si—N, where TM is any early transition metal from the Ti, V, or Cr group of the periodic table (the "early transition metals"). Barriers of this type have been successfully tested for electrical contacts to electrically active structures, such as solid-state devices of si, GaAs, and/or other semiconductors. For example, the reaction between a copper overlayer on a silicon substrate can be suppressed with a Ta—Si—N barrier layer up to a record-breaking 950° C. for 30 min in vacuum. These barrier layers have simultaneous amorphous or near-amorphous structure, high metastability, and chemical stability against reaction with silicon and copper.

Progress in technology and the increasing use of alternative materials has lead to processing and operation in highly oxidizing ambients. Although generally stable structurally and chemically, these ternary TM—Si—N films may react with oxygen. The resulting oxide is insulating, so that the TM—Si—N films cannot be used as barrier layers in electrical contacts of devices whose fabrication or operation exposes them to oxidizing ambients. For examples, Ta—Si—N layers have been tested in contacts to ferroelectric capacitors. In that application, the barrier layer is exposed to temperatures ranging up to 800° C. for duration of minutes, or at lower temperatures for extended durations. These heat treatments take place in an oxidizing ambient, not in vacuum as in the previous example of copper contacts to silicon. A problem then arises because Ta—Si—N films oxidize when heated in the presence of oxygen. A need therefore exists for thin films that share the positive attributes of TM—Si—N as diffusion barriers, but that will sustain exposures to a hot oxidizing ambient without reacting. Ternary TM—Si—O films provide a solution to this problem.

An embodiment describes specific devices that can be formed and a desired material for use in those devices. As described above, this desired material includes a first material which is an electrically conductive, fully-oxidized conducting transition metal mixed with a second material, which is another oxide material. The first and second materials are immiscible over the temperature range of interest, to form an amorphous material. A highly oxygenating atmosphere has oxygen which can diffuse into the materials. At low temperatures, (below the so called tamont temperature) diffusion occurs along the grain boundaries of the material. The preferred system described herein uses an amorphous oxidizing conductor which can prevent diffusion since it has substantially no grain boundaries and hence may be able to prevent many of these effects.

A low density capacitor structure is shown schematically in FIG. 1. This structure is a top contact type strap capacitor. A silicon based dielectric 100 encapsulates the device and protects it during fabrication of the ferroelectric material. Specifically, the dielectric material 100 can be polysilicon. A bottom electrode 102 is formed on the dielectric. A ferroelectric or high epsilon material oxide dielectric is formed between the bottom electrode 102 and the top electrode 108. The top electrode and/or bottom electrode are preferably formed of the fully oxidized amorphous conducting material described herein.

Typically a via 110 is opened in the silicon dielectric 100 after fabrication. The via is used to connect between the electrode 110 and the transistor formed under the dielectric. This transistor/capacitor structure then effectively forms one memory cell.

A higher density is obtained by using a "capacitor over bit line" type material. These materials have more stringent requirements for the bottom electrode structure. The materials on the bottom electrode shown as 200 must maintain a conductive path between the transistor and the capacitor. In addition, the integrity of devices must be maintained during preparation, which can be in temperatures in excess of 500° C. in an oxidizing environment.

The specified material described herein meets all of these requirements, is resistant to formation of an insulating oxide, remains electrically conductive after fabrication, forms a barrier to oxygen diffusion, a barrier to silicon diffusion and also does not interact with the dielectric or with the other material.

The capacitor-over-bit-line system includes a transistor 210 formed over a via 212. A conductive plug 213 fills the via and connects the transistor to a bottom electrode 200 formed of the fully oxidized material described herein. Since the capacitor is directly over the transistor, higher fill factor is obtained by this system.

The advantageous material described herein can also be used in other applications, including thick and thin film resistors, for coating on electrodes, especially in difficult environments such as oxidizing environments and space, in batteries, in electrochemical devices, catalysts, and in displays such as flat panel displays and plasma displays. These materials can also be used as contacts for high temperature superconductors.

The disclosed ternary TM—Si—O films rests on the combination of the TM—Si—N films and applying those materials to oxides. In a simplified way, Ta—Si—N films may be thought of as a combination of tantalum nitride and silicon nitride, that is, a kind of a mixture of the metallic conductor TiN and the of the insulator $Si_3N_4$. These two nitrides are immiscible. This immiscibility is the reason why the ternary nitrides becomes highly metastable when deposited by a process that generates a random mixture of the constituting elements. A combination of two immiscible oxides will then lead to a ternary alloy that is also highly metastable, but is already oxidized. For example, ruthenium dioxide is a metallic conductor, like tantalum nitride is, and $Sio_2$ is an insulator, like silicon nitride is. These two oxides are also immiscible. The combination of these two compounds will thus also lead to a type of ternary Ru—Si—O alloy that is already oxidized and, by analogy with TM—Si—N films, will have properties similar to those of the TM—Si—N films. Besides $RuO_2$, a number of other electrically conducting oxides exists, of which $OSO_2$, $RhO_2$, and $IrO_2$ are closely related to $RuO_2$. They all have the potential of forming amorphous or near-amorphous films when combined with $SiO_2$ in the way RuO2 does. This group of materials can be described analogously to TM—Si—N alloys as ternary TM—Si—O alloys, where TM is any of the foregoing metals. $CrO_2$, $MoO_2$, $WO_2$, TiO, $ReO_3$ and $In_2O_3$ are also conducting oxides and are considered as further possibilities for TM—Si—O alloy formation.

The TM—Si—O films described herein have simultaneous amorphous or near-amorphous structure, very high metastability, and stability against reaction with noble elements and with oxidizing ambients.

The specific material is of the type Tm—Si—O where Tm is a ternary metal of the type that forms a conducting oxide. This ternary metal can be ruthenium (Ru), iridium (Ir), osmium (Os), Titanium (Ti), indium (In), chromium (Cr), tungsten (W), rhenium (Re), rhodium (Rh), or molybdenum (Mo) with the first three listed materials being most preferred.

The material forms a metastable combination of two immiscible oxide materials. Since the materials are metastable, none or virtually no crystalline combinatorial structures are formed. Using the example of the transition metal being ruthenium, ruthenium dioxide and silicon dioxide are not miscible at room temperature. If they are heated, no ruthenium-silicon oxide crystalline phase is formed. Therefore, the material forms an amorphous phase between the different oxide materials. The material is metastable in the sense that it is stable over the temperatures of interest. When heated above the temperature of interest, the combined material could disassociate.

The second immiscible oxide could be any oxide material that forms. Silicon dioxide is preferred since many of the semiconductor operations are carried out on a silicon substrate. Any material other than silicon could also form an undesirable silicide based on an undesired combination between the silicon in the substrate and the other material of the insulator.

Material Formation

The material is formed using a brute force process. If the material were simply mixed, it would form ruthenium dioxide sites and silicon dioxide sites. The system described herein uses energy to place the two materials together in an atomic mix. Since the materials cannot move, they effectively become jammed into place. Either no crystals or very few crystals are formed by this operation. This effectively forms a boundary.

Figure 3:
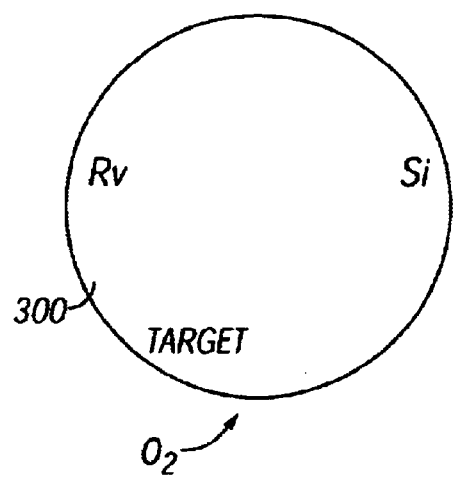
FIG. 3 show a formation technique.

One way of formation is shown with reference to FIG. 3. A conventional sputtering target 300 is formed including ruthenium and silicon thereon. The target is sputtered using an energized $O_2$ gas. The oxygen in the gas combines with both the ruthenium and silicon to form a mixed by-product.

The final materials is believed to be $Ru_{-20}$, $Si_{-15}$, $O_{-65}$.

Alternative formation techniques use other energetic processes to molecularly include the materials therein. Alternate formation techniques include chemical vapor deposition, a sol-gel. deposition technique or laser ablation.

The desired material therefore takes two effectively immiscible oxide materials and forces them together into an amorphous phase. This amorphous phase is meta-stable in the sense that it stable over the temperatures of interest. Over that temperature range, the material remains as a ternary dimorphous oxide.

Preferred Materials

The preferred materials include $RuO_2+SiO_2$ or $IrO_2+Sio_2$. As described above, when $RuO_2$ is heated, it can form $RuO_4$ which is a volatile gas. It is believed by the inventors that $IrO_2$ may be in some senses superior to $RuO_2$, since the $IrO_2$ may not form $Iro_4$ quite as easily.

$OSO_2$ could also be used.

Other materials include $In_2O_3$, $TiO_2$, $CrO_2$, $WO_2$, $ReO_3$, $RhO_2$, $MoO_2$.

The second material can be $SiO_2$ or any other oxide material which is immiscible with the first material. One example is $Al_2O_3$. The compounds that are used should have one common element, here oxygen, but be immiscible with one another. By forcing these two materials together, a meta-stable amorphous phase is obtained.

The application of these novel films in contacts to ferroelectric materials is but one example. These novel films possess superior attributes as contacts to all oxygen-bearing materials such as high dielectric materials, high Tc materials, piezoelectric materials, or inorganic electroluminescent materials. Furthermore, they offer advantages in harsh environments, such as for electrodes of batteries, for plasma displays, and for elements operating in corrosive environments like electrodes or resistors for thermal ink-jet printers.

Applications generally fall into one of several categories, according to whether the novel film is to assure stability in a material system during its formation (short-term stability requirement), or during its use (long-term stability requirement), of both.

The inventors intend the embodiments described above to be examples of the general concept, and that those of skill in the art would understand that modifications are possible.

What is claimed is:

1. An electronic capacitive device, comprising:

an electrically active structure; and a conducting layer, formed on said electrically active structure, said conductive layer consisting essentially of three materials forming a ternary oxide material having first and second immiscible compounds, said first and second immiscible compounds having one common element, wherein said first compound is of the form $TmO_x$ where Tm is a transition metal that is one of Ru, Mo, Rh, Os, Re, W, Cr, Ti, In or Ir, and said second compound is of the form $Jo_y$, where J is a different material than Tm and said first and second compounds being formed in an amorphous state, and being meta-stable relative to one another over a temperature range, and wherein said common element is oxygen, said conductive layer and said electrically active structure collectively forming a part of a capacitor.

2. A device as in claim 1 wherein said second material is $SiO_2$.

3. A device as in claim 1, wherein said second compound is $SiO_2$.

4. An electronic capacitive device, comprising:

an electrically active structure; and a conducting layer, formed on said electrically active structure, said conductive layer consisting essentially of three materials forming a ternary oxide material having first and second immiscible compounds, said first and second immiscible compounds having one common element, which are formed in an amorphous state, and are meta-stable relative to one another over a temperature range, and wherein said common element is oxygen, said conductive layer and said electrically active structure collectively forming a part of a capacitor, wherein said first material is $RuO_2$, and said second material is $SiO_2$.

5. A metallic oxide material, consisting essentially of a amorphous combination of a first material formed of $SiO_2$, and a second oxide material formed of $RuO_2$, wherein said first and second oxide materials are immiscible to form said amorphous phase.

\* \* \* \* \*